United States Patent

Kemerer et al.

[15] 3,656,004

[45] Apr. 11, 1972

[54] BIPOLAR CAPACITOR DRIVER

[72] Inventors: Douglas W. Kemerer, Beacon; Jehoshua N. Pomeranz, Monsey, both of N.Y.

[73] Assignee: International Business Machines Corporation, Armonk, N.Y.

[22] Filed: Sept. 28, 1970

[21] Appl. No.: 75,994

[52] U.S. Cl. ..............................307/246, 307/214, 307/215, 307/218, 307/300

[51] Int. Cl. .......................................................H03k 17/00

[58] Field of Search..................307/214, 215, 218, 246, 250, 307/270, 280, 300

[56] References Cited

UNITED STATES PATENTS

| | | | |
|---|---|---|---|
| 3,519,851 | 7/1970 | Groner | 307/246 X |
| 3,553,601 | 1/1971 | Glasser | 307/214 X |
| 3,427,474 | 2/1969 | Chua | 307/246 |
| 3,440,440 | 4/1969 | Prohofsky et al. | 307/215 X |
| 3,522,444 | 8/1970 | Lourie | 307/218 X |
| 3,555,294 | 1/1971 | Treadway | 307/218 X |

OTHER PUBLICATIONS

D' Agostino, " Reactive Emitter-Follower Gate," RCA Technical Notes, No. 791, Sept. 25, 1968

*Primary Examiner*—Donald D. Forrer
*Assistant Examiner*—R. C. Woodbridge
*Attorney*—Hanifin and Jancin and James E. Murray

[57] ABSTRACT

This specification discloses a bipolar driver which will charge a capacitive load to substantially the potential supplied to the driver. The driver includes two transistors that couple the load to a source of potential. One transistor is connected in shunt with the load while the other transistor is connected in series with the load and the source of potential. The shunt-connected transistor is used to discharge the capacitive load while the serially connected transistor is used to charge the capacitive load with charge from the source of potential. To allow the capacitive load to be charged to the full potential of the source, the driver includes circuitry which decouples the base of the serially connected transistor from the source of potential and drives the transistor with charge accumulated in the base-to-emitter junction of the transistor so that the serially connected transistor will not be turned off until the potential across the capacitive load reaches the potential of the driving source.

8 Claims, 1 Drawing Figure

Patented April 11, 1972 3,656,004
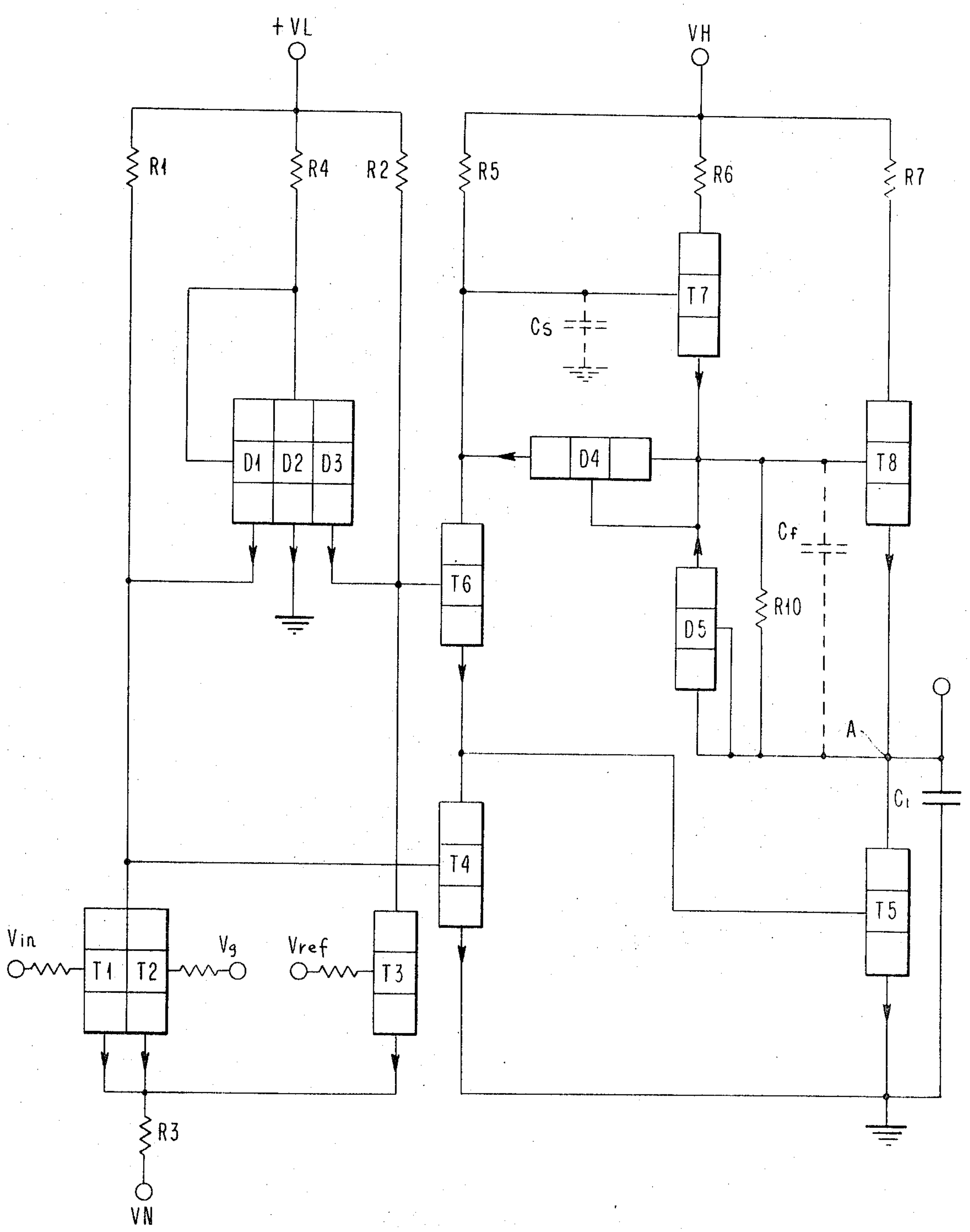
INVENTORS
DOUGLAS W. KEMERER
JEHOSHUA N. POMERANZ
BY James E. Murray
ATTORNEY

BIPOLAR CAPACITOR DRIVER

BACKGROUND OF THE INVENTION

This invention relates to bipolar circuits for charging and discharging a capacitive load and more particularly to such circuits for charging and discharging a capacitive load with a minimum power dissipation.

One problem with monolithic circuits is that as they operate they cause heating of the monolithic chips on which they are formed. To keep these chips operating it is necessary that the chip be cooled to dissipate this heat. As the circuit density, or the number of circuits on a given area of the chip, is increased the problem of cooling the chip becomes more critical and expensive apparatus must be used in order to maintain the chip at an operating temperature level. At even higher circuit densities it becomes impossible to cool the chip with conventional cooling systems. For this reason, the dissipation of heat by the circuits materially adds to the cost of the circuits and is also a limiting factor on the speed and size of the circuits. Therefore, it is desirable to reduce the heat dissipated by the circuits.

In the case of a driver for charging and discharging a capacitive load the amount of heat dissipated by the driver is a function of the square of the potential supplied to the driver. Therefore, any reduction in this potential would cause a considerable reduction in the power dissipated. Furthermore, as the supply potential increases in magnitude so does the cost of power supply needed to generate it. For these reasons, it would be very desirable to have a capacitor driver which would charge a capacitive load to the full potential of the driver's power supply. However, up until now it has been very difficult to provide such a driver because the transistor which conducts current from the supply to the capacitive load is usually cut off as the charge on the capacitor approaches the supply potential thereby preventing the capacitor from being fully charged.

Now, in accordance with the present invention a bipolar driver for a capacitive load is provided which will operate on driving potentials that are approximately the same size as the voltage supplied to the capacitive load. This driver has two transistors that couple the load to the driving source. One transistor is connected in shunt with the capacitive load and the other transistor is connected in series between the load and the source of potential. The shunt-connected transistor is used to discharge the capacitive load while the serially connected transistor is used to charge the capacitive load with charge from the driving source. To allow the capacitive load to be charged to the full potential of the source, the driver includes circuitry which decouples the base of the serially connected transistor from the source of potential and drives the transistor with charge accumulated in the base-to-emitter junction of the transistor so that the serially connected transistor will not be turned off until the potential across the capacitive load reaches the full potential of the driving source.

Therefore, it is an object of this invention to provide a driver for a capacitive load.

It is another object of this invention to provide a driver for the capacitive load that provides output signals of substantially the same magnitude as the operating potential applied to the driver.

Other objects of the invention are to decrease the power dissipation of the capacitive drivers, increase the density at which these circuits can be fabricated on monolithic chips, and decrease the size of power supplies necessary to drive these circuits.

DESCRIPTION OF THE DRAWING

The foregoing and other objects, features and advantages of the invention will be apparent from the following more particular description of the preferred embodiment of the invention as illustrated in the accompanying drawing which is an electrical schematic diagram of a capacitor driver.

Referring to the sole FIGURE, transistors T1, T2 and T3 with resistors R1, R2 and R3 form a current switch. When either or both the potentials Vin or Vg exceeds the potential Vref, transistor T3 is off and either or both transistors T1 and T2 are conducting the current from the current source consisting of voltage source VL and resistor R3. Alternatively, when the voltages Vin and Vg are both less than the voltage Vref, transistor T3 conducts the current from the mentioned current source to the exclusion of transistors T1 and T2.

A voltage limiter consisting of resistor R4 and diodes D1, D2 and D3 controls the voltage swing at the collectors of transistors T1, T2 and T3. Current flows through resistor R4 and diode D2 to ground. This essentially places the plates of diodes D1 and D3 at 0.7 volts above ground so that when the potential at the collector of any one of the transistors T1, T2 or T3 drops below ground either diode D1 or D3 conducts, preventing that collector from dropping further. While the voltages at the collectors are all above ground, the diode D1 or D3 is not sufficiently forward biased to have any effect on the circuit.

The collectors of both transistors T1 and T2 are connected to the base of transistor T4 so that when transistors T1 and T2 are both biased non-conducting transistor T4 will be held on by the potential supplied to its base through resistor R1. The collector of transistor T4 is in turn connected to the base of transistor T5 so that transistor T5 will be biased off, allowing node A to rise as charge is supplied to the capacitive load CL connected in shunt with transistor T5.

As pointed out above, while both transistors T1 and T2 are not conducting transistor T3 is conducting causing the collector of transistor T3 to be at ground potential. The base of transistor T6 is connected to the collector of transistor T3 and is biased off while transistor T3 is conducting. Resistor R5 connects both the collector of transistor T6 and the base of transistor T7 to the positive terminal of the source VH so that transistor T7 is conducting when transistor T6 is off. With transistor T7 on current flows through resistor R6 and transistor T7 to provide base drive for transistor T8, turning transistor T8 on and thereby charging the capacitive load CL through resistor R7 and transistor T8.

Since transistor T5 is off at this time this means that the charge will accumulate on the capacitor CL. As the charge does accumulate the potential at node A or the emitter of transistor T8 rises. When the potential at node A approaches within two Vbe drops of the potential at the positive terminal of the driving source VH it causes the potential at the emitter of transistor T7 to come within one Vbe drop of that potential. Therefore, when the voltage across the capacitor CL increases still further it reduces the voltage across the base-to-emitter junction of transistor T7 below one Vbe drop cutting off transistor T7 and allowing the base of transistor T8 to float with respect to the emitter of transistor T8. When this occurs, charge stored in the base-to-emitter capacitance CF of transistor T8 supplies driving current for transistor T8 maintaining transistor T8 on until the potential at the emitter of transistor T8 approaches the supply potential VH or the charge on the capacitor CF is dissipated.

For the circuit to operate in the described manner it is necessary that the time constant consisting of stray capacitance at the base of transistor T7 and resistor R5 be smaller than the time constant consisting of capacitor CL and resistor R7. It is also desirable that the capacitor CF be as large as possible since the bigger this capacitor the larger base drive current it supplies to the transistor T8.

Once the capacitive load CL is charged, the charge on the capacitor CL can be dissipated by turning transistor T5 on. This is accomplished by reducing the voltage at both the Vin and Vg inputs lower than the reference voltage Vref. This turns transistor T4 off and transistor T6 on allowing the base of transistor T5 to rise towards 8 volts to turn transistor T5 on. As transistor T5 conducts it reduces the voltage across the capacitor towards ground. Also, as the voltage at the collector of transistor T6 is reduced diode D5 and diode D4 conduct current from the emitter of transistor T8 through transistor T6 to the base of transistor T5 so that the charge on the capacitive load CL is used to drive the discharging transistor T5. This speeds up the turning-off operation allowing transistor T5 to be driven very hard considering the potential used to operate the circuit. Resistor R10 is a leakage resistor preventing stray charge from building up capacitor CF and accidentally turning transistor T8 on.

Above one embodiment of the invention has been described. As has been seen, it requires a minimum potential to charge a capacitive load because the transistor T8 is not turned off as the potential approaches the supply potential VH. If the parameters were not properly selected as described above the charging of the capacitive load would stop as the potential at the emitter of transistor T8 comes within two Vbe drops of approximately 1.5 volts of the supply voltage VH. Assuming the capacitive load CL is to be charged to 8 volts, this would mean that a supply potential VH of approximately 9.5 volts would be necessary, in the case of prior art circuits, while only 8 volts is necessary with circuits made in accordance with the present invention. Since the power dissipated is related to the square of power supply voltage it would mean that the dissipation in the case of prior art circuits would be more than 1.4 times the dissipation of the present circuit.

While the invention has been particularly shown and described with reference to the preferred embodiment thereof, it will be understood by those skilled in the art that various changes in form and detail may be made therein without departing from the spirit and scope of the invention.

What is claimed is:

1. A bipolar driver for charging a capacitive load from a voltage source comprising:

a. a first bipolar transistor with its collector-to-emitter path connected in shunt with the capacitive load;

b. a second bipolar transistor with its collector-to-emitter path connected in series between the source and the capacitive load and having its emitter connected to the collector of the first transistor at the node of the capacitive load to be charged;

c. discharge control means coupled to the base of the first bipolar transistor for turning on said first bipolar transistor to discharge said node of the capacitive load; and d. charge control means coupled to the base of the second bipolar transistor for supplying drive from the source to the base of said second bipolar transistor for turning on said second bipolar transistor to charge said node of the capacitive load, said charge control means including means for decoupling the base of the second transistor from the source of potential when the potential at said node approaches the potential at the base of the second bipolar transistor so that the base-to-emitter junction capacitance of the second bipolar transistor supplies base drive to the second bipolar transistor to charge said node to substantially the full potential of said voltage source.

2. The bipolar driver of claim 1 wherein said charge control means includes a third bipolar transistor with its collector-to-emitter path connected between the base of the second bipolar transistor and a terminal of the source of potential in a Darlington connection and its base coupled through a resistor to the same terminal of voltage source.

3. The bipolar driver of claim 2 wherein the charging time constant for the circuit coupling the base of the third bipolar transistor to the source of potential is smaller than the time constant for charging the capacitive load through the second bipolar transistor.

4. The bipolar driver of claim 3 including a fourth bipolar transistor with its collector-to-emitter path connected between the bases of the third and first transistors whereby when said fourth transistor is on said first transistor is conducting and when said fourth transistor is off said third transistor is biased non-conducting.

5. The unipolar driver of claim 4 including a unidirectional current path means from said node to the base of said first bipolar transistor through said fourth bipolar transistor when said fourth bipolar transistor is conducting to supply base drive to the first bipolar transistor from said capacitive load.

6. The bipolar driver of claim 5 including a fifth bipolar transistor with its collector-to-emitter path connected between the base and emitter of said first bipolar transistor, said fifth bipolar transistor being on when said fourth bipolar transistor is on and off when said fourth bipolar transistor is on.

7. A bipolar driver of claim 6 including a differential amplifier whereby said third and fourth bipolar transistors are driven by outputs of the base outputs of said differential switch.

8. The bipolar driver of claim 7 including back-to-back diodes connected between the outputs of a differential amplifier and a third diode connecting the common terminals of the two back-to-back diodes to a reference level and a resistor coupling the common terminals of two back-to-back diodes to a voltage level other than the reference level whereby the outputs of the differential amplifier are limited at the reference level.

* * * * *